(12) United States Patent
Chang et al.

(10) Patent No.: US 7,408,215 B2
(45) Date of Patent: Aug. 5, 2008

(54) DYNAMIC RANDOM ACCESS MEMORY

(75) Inventors: Ming-Cheng Chang, Tao-Yuan Hsien (TW); Neng-Tai Shih, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 11/696,160

(22) Filed: Apr. 3, 2007

(65) Prior Publication Data

US 2008/0029800 A1 Feb. 7, 2008

(30) Foreign Application Priority Data

Aug. 2, 2006 (TW) .............................. 95128296 A

(51) Int. Cl.
H01L 27/108 (2006.01)
H01L 29/76 (2006.01)
H01L 29/94 (2006.01)
H01L 31/119 (2006.01)

(52) U.S. Cl. ..................... 257/301; 257/302; 257/296; 257/774; 257/E21.278; 257/E21.304; 257/E21.646; 438/243; 438/386

(58) Field of Classification Search ............... 257/68, 257/301, 302, 382, 387, 296, 774; 438/243, 438/386
See application file for complete search history.

(56) References Cited

U.S. PATENT DOCUMENTS

| 6,818,515 | B1 * | 11/2004 | Lee et al. | ..................... 438/284 |
| 7,087,947 | B2 * | 8/2006 | Lee et al. | ..................... 257/296 |
| 2007/0228460 | A1 * | 10/2007 | Che | ........................ 257/330 |
| 2008/0032471 | A1 * | 2/2008 | Kuo et al. | ................... 438/243 |

* cited by examiner

*Primary Examiner*—David Nhu
(74) *Attorney, Agent, or Firm*—Winston Hsu

(57) ABSTRACT

A DRAM structure on a silicon substrate has an active area, gate conductors, deep trench capacitors, and vertical transistors. The deep trench capacitors are formed at intersections of the active area and the gate conductors, and each deep trench capacitor is coupled electrically to the corresponding vertical transistor to form a memory cell. The transistor includes a gate, a source in a lateral side of the gate, and a drain in another lateral side of the gate The depth of the drain is different from the depth of the source.

8 Claims, 6 Drawing Sheets

DYNAMIC RANDOM ACCESS MEMORY

CROSS-REFERENCE TO RELATED APPLICATIONS

This application is based upon and claims the benefit of priority from prior Taiwan Patent Application No. 095128296 filed Aug. 20, 2006.

BACKGROUND OF THE INVENTION

1. Field of the Invention

The invention relates to dynamic random access memory (DRAM), and more particularly, to a checkerboard trench DRAM.

2. Description of the Prior Art

Electrical products are becoming lighter, thinner, shorter, and smaller, and dynamic random access memory (DRAMs) geometries are being scaled down to match the trends of high integration and high density. In a conventional planar trench capacitor DRAM, a source, a gate, and a drain of a MOS transistor are horizontally positioned on a surface of a substrate. This is an important factor affecting a design of a size of transistors in the DRAM. Therefore, vertical transistors are used in trench capacitor DRAMs.

Generally speaking, fabrication of a vertical transistor structure involves etching the substrate for producing a deep trench, fabricating a trench capacitor in the deep trench, forming a vertical transistor near the trench capacitor, and locating the drain, gate, and source vertically to decrease a horizontal area of the transistor substantially and increase semiconductor component integration.

A length and a width of the gate channel are important factors that affect an efficiency of the vertical transistor in a vertical transistor trench capacitor DRAM. The length of the gate channel decides a channel length, along which electrons pass from the source to the drain. The width of the gate channel decides a number of electrons that pass from the source to the drain. If the length of the gate channel can be shortened in the vertical transistor trench capacitor DRAM, a leakage of the transistor will be decreased significantly, and the efficiency of the vertical transistor trench capacitor DRAM will increase.

Industry research has produced a checkerboard trench-DRAM. One transistor matches with a corresponding trench capacitor in the checkerboard trench-DRAM. It is suitable for 90 nm manufacture in order to improve planar standard manufacture, and to achieve satisfactory capacitances without needing to use a high dielectric material. If a vertical transistor with a shorter gate channel length could be fabricated, the leakage current effect of the transistor could be decreased. And applying the vertical transistor to the checkerboard trench DRAM could greatly increase the effectiveness of the checkerboard trench DRAM. Thus, developing a vertical transistor with a short gate channel length is an important objective of the semiconductor industry.

SUMMARY OF THE INVENTION

The present invention provides a DRAM to solve the above problems of the prior art.

According to the present invention, a dynamic random access memory (DRAM) is on a silicon substrate. It comprises at least an active area on the silicon substrate, a plurality of gate conductors on the silicon substrate, a plurality of deep trench capacitors and a plurality of vertical transistors. Each deep trench capacitor is located at an intersection of the active area and each gate conductor in the silicon substrate, respectively. Each vertical transistor connects with the corresponding deep trench capacitor to form a memory cell. Each vertical transistor further comprises a gate, a source in one side of the gate, and a drain in another side of the gate. A depth of the source is different from a depth of the drain.

The depth of the drain of the transistor is deeper than the depth of the source in the present invention, but a drain and a source have the same depth in the prior art. Therefore, the channel length of the transistor in the present invention is longer, such that leakage current is decreased. In order to control the depths of the drain and the source easily, the present invention need only control different energies of the ion implantation processes or an ion dose. Fabrication is also simpler.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
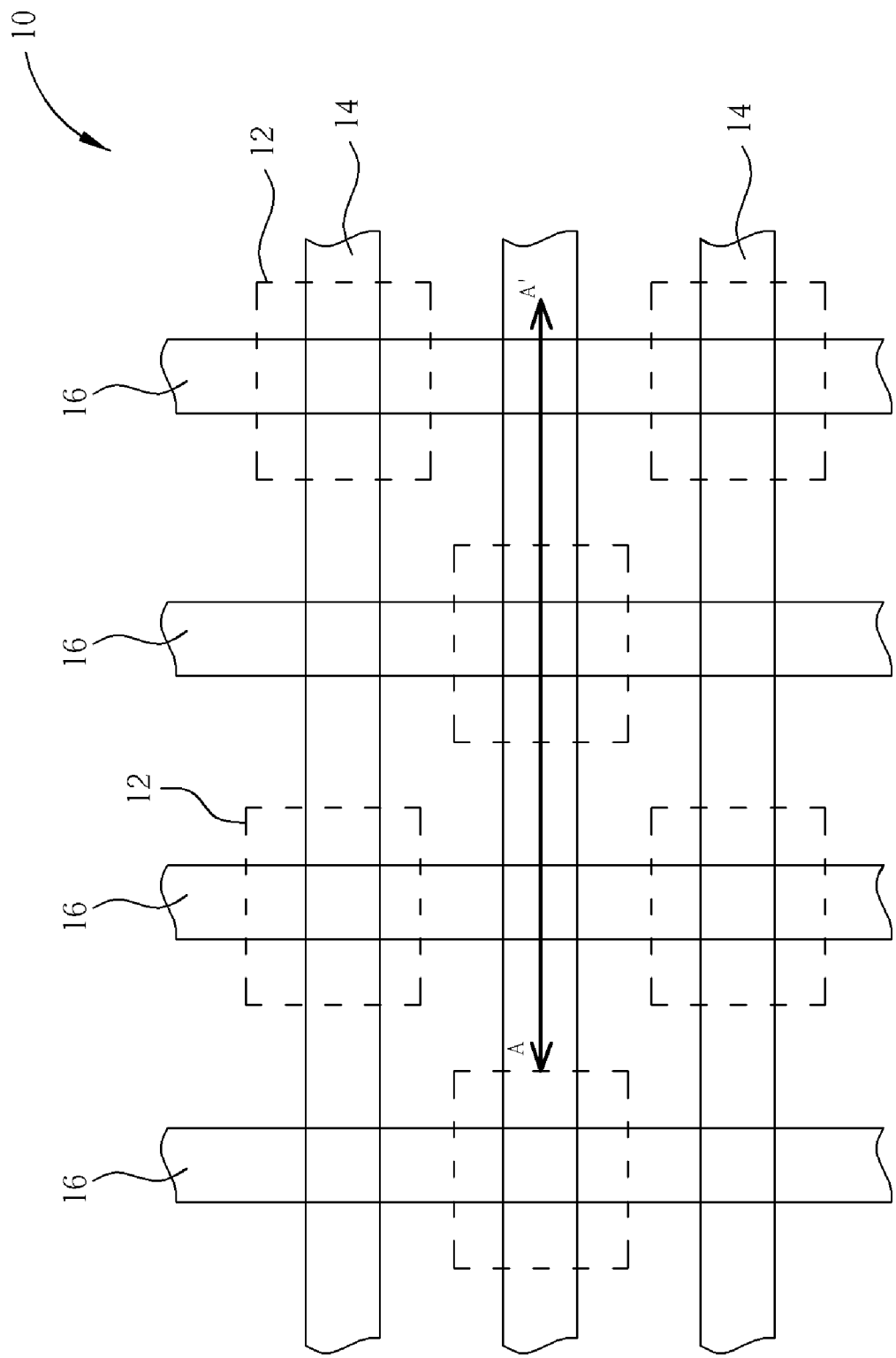
FIG. 1 is a diagram, which illustrates a checkerboard trench-DRAM according to the present invention.
Figure 2:
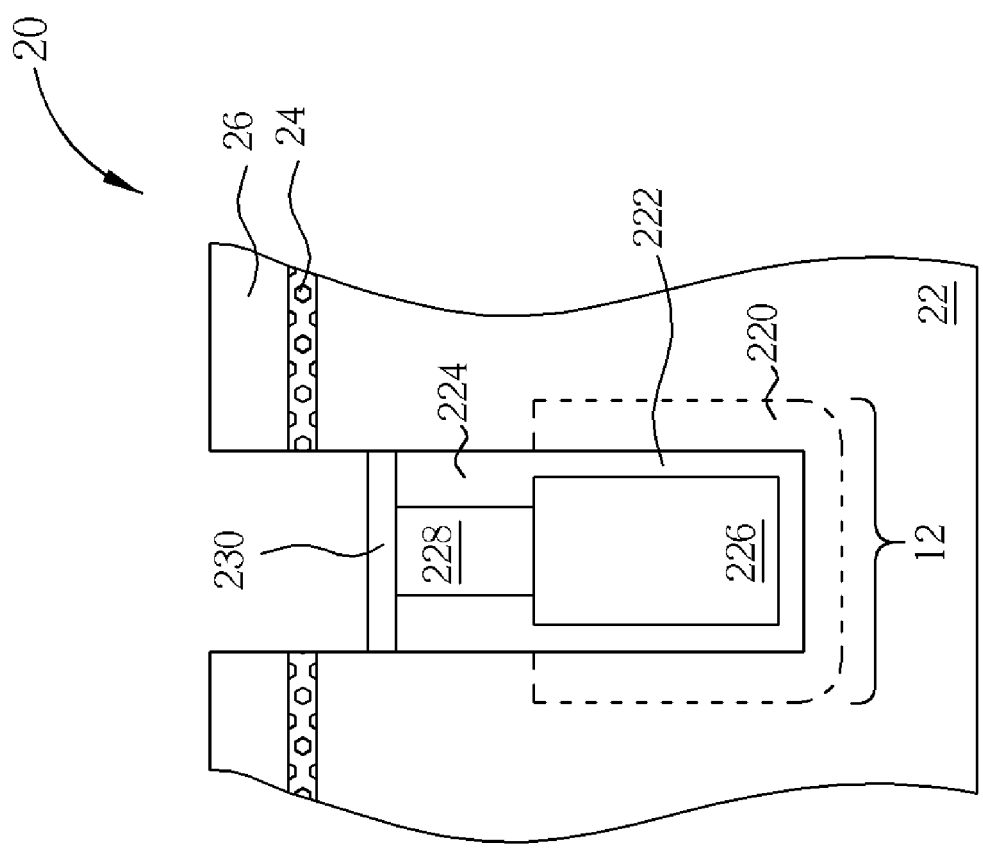
FIGS. 2 to 6 are diagrams, which illustrate fabrication of a checkerboard trench-DRAM according to the present invention.

Please refer to FIG. 1. FIG. 1 is a diagram, which illustrates a checkerboard trench-DRAM according to the present invention. A memory array area 10 of the checkerboard trench-DRAM has a plurality of deep trench capacitors 12. The deep trench capacitors 12 are staggered in a checkerboard layout pattern as shown in FIG. 1. An active area (AA) 14 and a gate conductor (GC) 16 are perpendicular to each other and crisscross at each deep trench capacitor 12. Each transistor (not shown) matches with a deep trench capacitor 12. This one transistor matched with one deep trench capacitor 12 structural characteristic is a defining feature of the checkerboard trench-DRAM.

Figure 5:
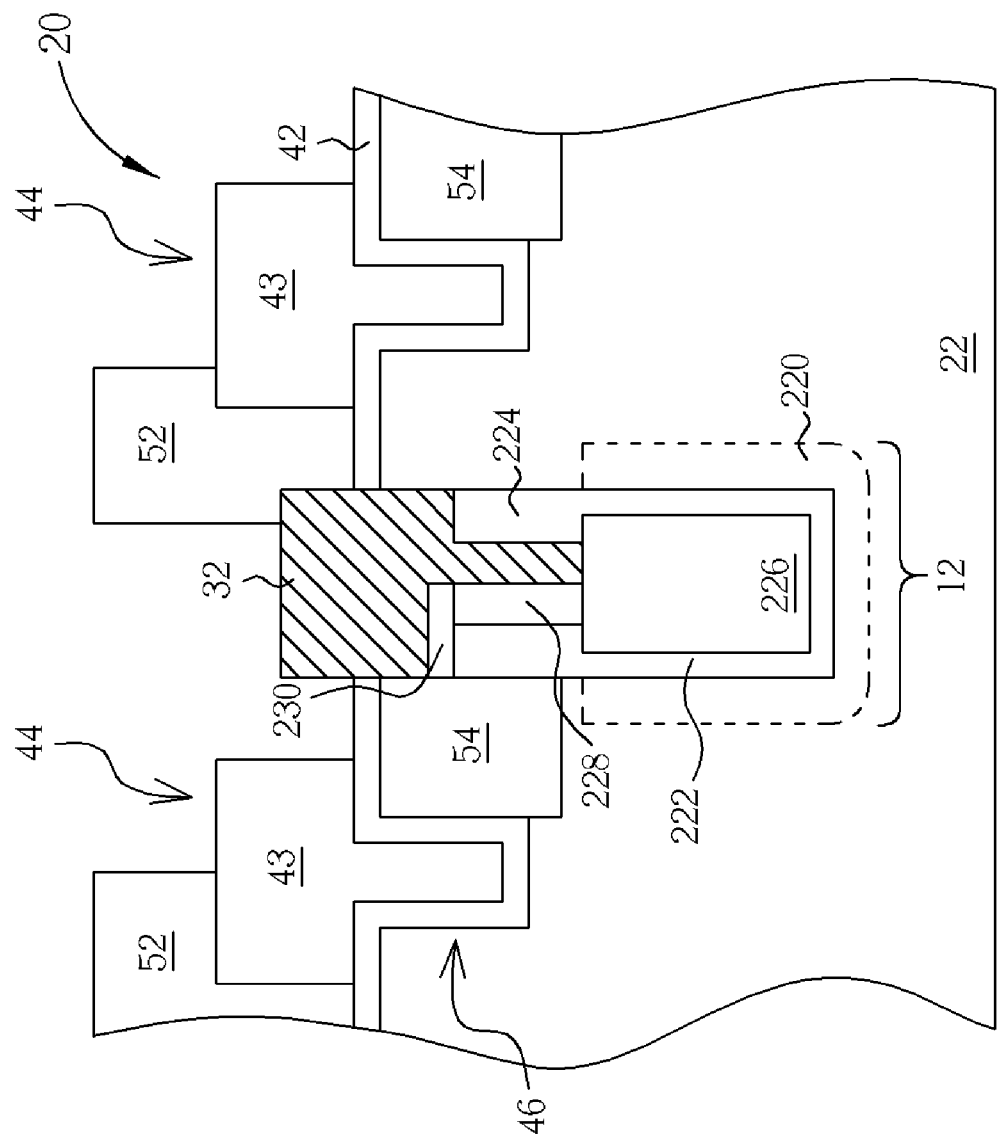
Figure 6:
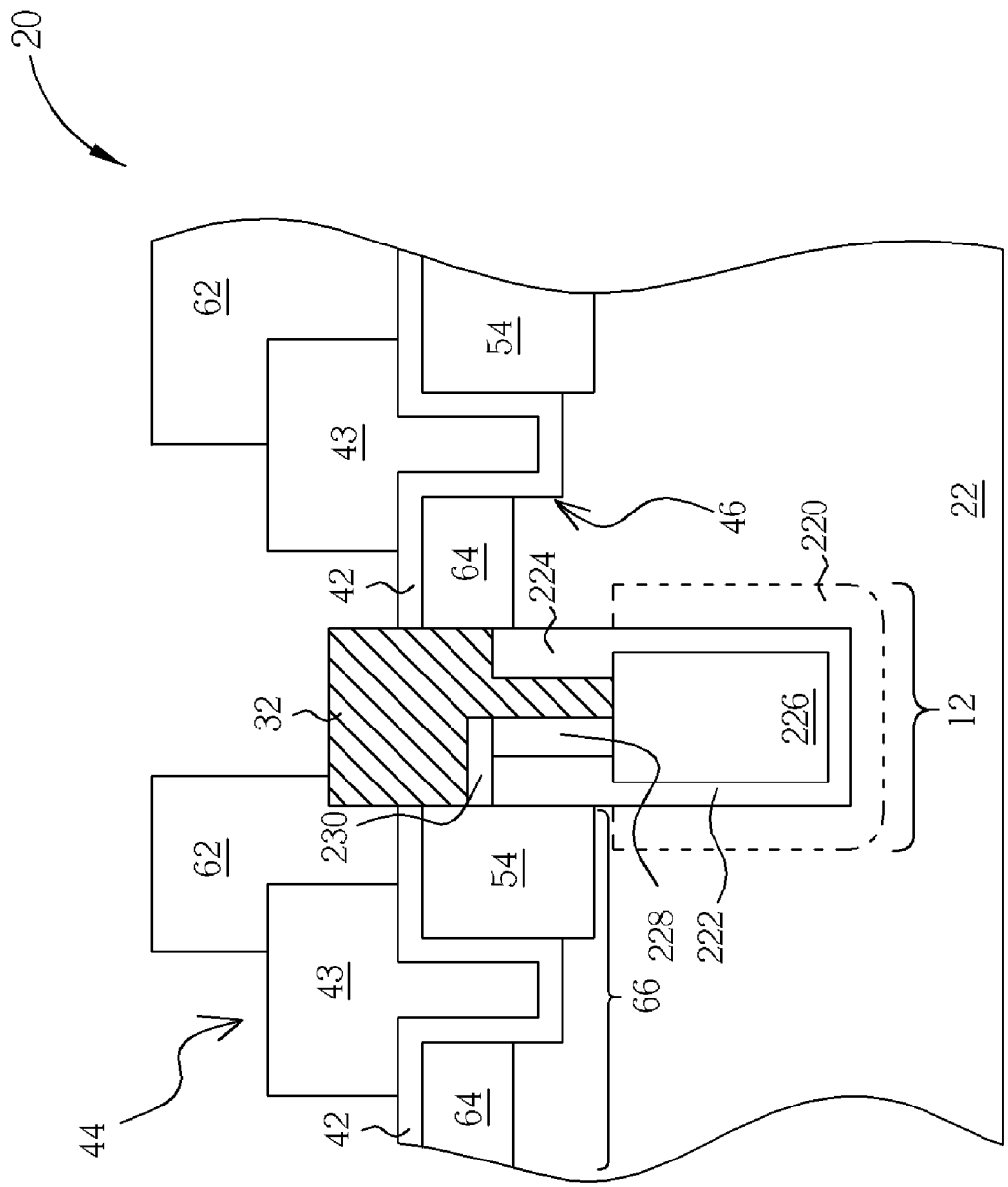

Please refer to FIGS. 2 to 6. FIGS. 2 to 6 are diagrams, which illustrate fabrication of a checkerboard trench-DRAM according to the present invention. FIGS. 2 to 6 illustrate fabrication of the checkerboard trench-DRAM in FIG. 1. FIG. 6 illustrates a cross-section at line AA'. As shown FIG. 2, the checkerboard trench-DRAM 20 of the present invention is formed on a silicon substrate 22, e.g. a semiconductor wafer or a silicon-on-insulator. A pad oxide 24 and a silicon nitride 26 are formed on a surface of the silicon substrate 22. In order to fabricate the deep trench capacitor 12 in the memory cell, the present invention utilizes a patterned photoresist layer as a mask (not shown) to define each deep trench capacitor 12 on the surface of the silicon substrate 22. An etching process is performed to etch the silicon nitride layer 26 to transfer the pattern of the photoresist layer to the silicon nitride layer 26. The patterned silicon nitride layer 26 is utilized as a mask and an etching process is performed to form the deep trenches.

An arsenic silicate glass (ASG) diffusion process is performed to form a diffused region as a lower electrode 220 in the bottom of the deep trench in the silicon substrate 22. Then, after the arsenic silicate glass is removed, a dielectric layer 222, such as an oxide-nitride-oxide (ONO) layer, is formed on the surface of the deep trench as a capacitor dielectric layer of the deep trench capacitor 12. Then, deposition and etching processes are performed to form a polysilicon layer 226 as an upper electrode of the deep trench capacitor 12 in the bottom of the deep trench. An oxide layer (not shown) is formed on the polysilicon layer 226 of the deep trench capacitor 12 and a polysilicon layer (not shown) is filled in. An etching process is performed to form a neck oxide layer 224 and a polysilicon layer 228. A polysilicon layer (not shown) is filled in and an etching process is performed to form a polysilicon layer 230 to complete a standard fabrication process of the deep trench capacitor 12.

Figure 3:
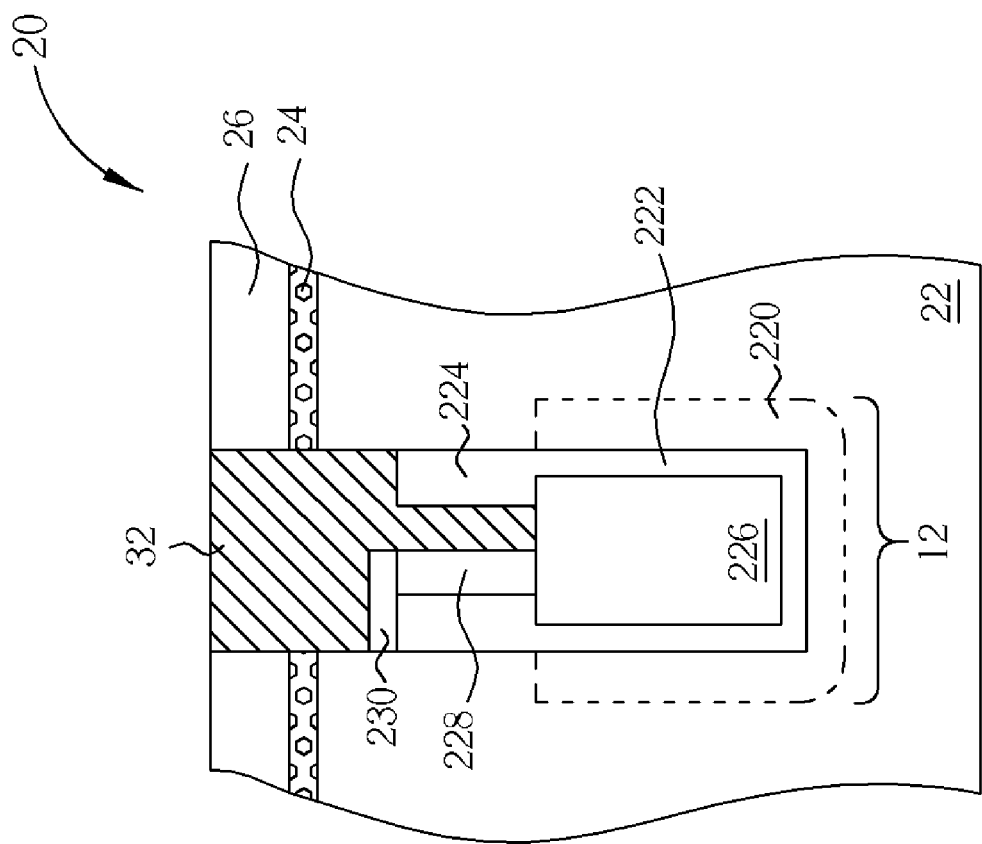
Figure 4:
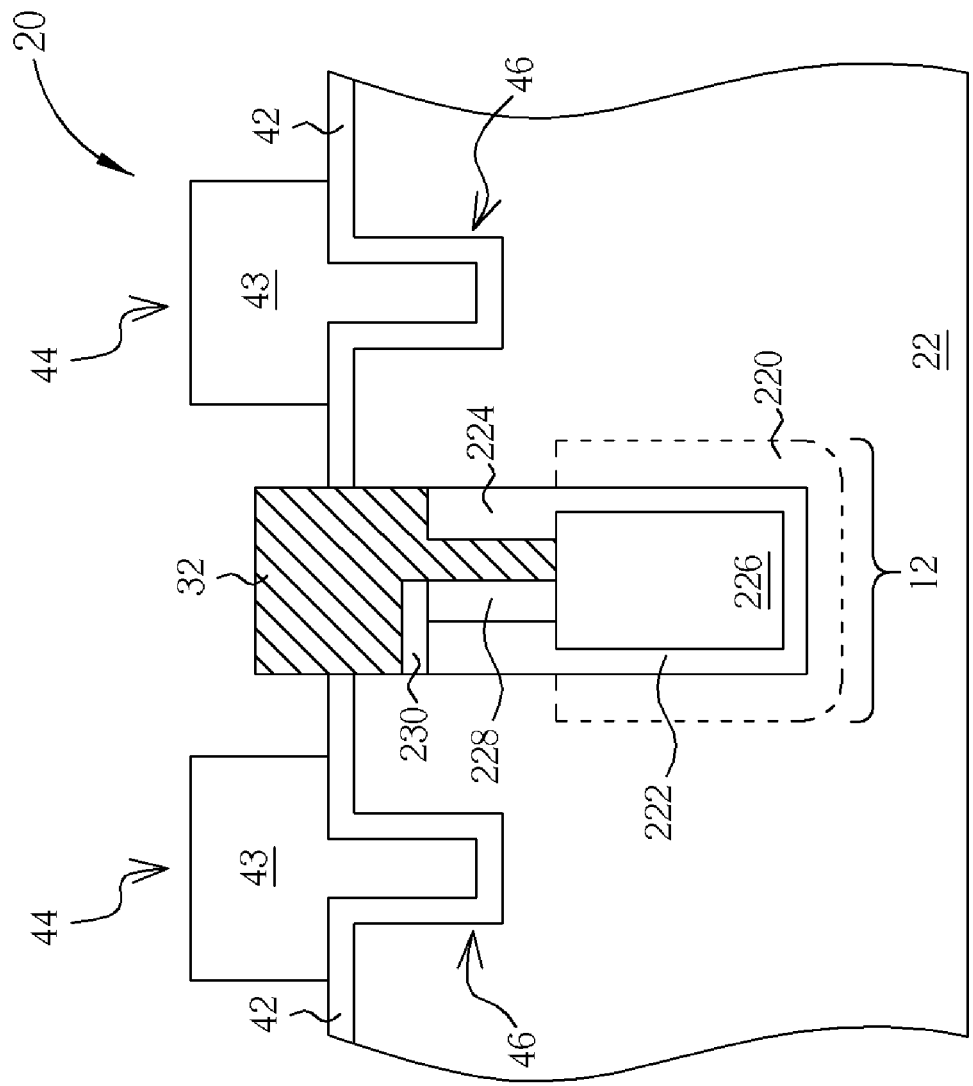

Please refer to FIG. 3. A single sided buried strap process is performed. A photoresist layer defines a location of a shallow trench isolation (STI) 32. An etching process is performed to separate polysilicon layers 230, 228, 226. A dielectric material such as silicon oxide is filled therein. A chemical mechanical polishing (CMP) process is performed to form the shallow trench isolation 32, and the location of the active area 14 in FIG. 1 is defined at the same time. Please refer to FIG. 4. The pad oxide 24 and the silicon nitride layer 26 are removed. A patterned photoresist layer (not shown) is utilized to define a gate recess 46 in the silicon substrate 22. An etching process is performed to form each demanded gate recess 46 in the silicon substrate 22. A gate insulating layer 42 is formed on the silicon substrate 22 and the gate recess 46 by a heat oxidation process. A polysilicon layer (not shown) is deposited on the silicon substrate 22 to fill each gate recess 46. An etching process is performed to remove part of the polysilicon layer. A polysilicon layer (not shown) is deposited on the silicon substrate 22 and each gate recess 46. A patterned photoresist layer is utilized to define locations of a gate stack 44 and the gate conductor 16, and an etching process is performed on the polysilicon layer to finish fabrication of the gate conductor 16. The polysilicon layer 43 in the gate recess 46 is the gate of the transistor in the memory cell.

Please refer to FIG. 5. As shown FIG. 5, a patterned photoresist layer is a mask 52 for forming a drain 54. An ion implantation process is performed to form the drain 54 of the transistor. The mask 52 is removed. Please refer to FIG. 6. A patterned photo resist layer is a mask 62 for forming a source 64. An ion implantation process is performed to form the source 64 of the transistor. The mask 62 is removed. In the present invention, the drain 54 and the source 64 are formed by different ion implantation processes. Therefore, order of fabrication, an ion dose, and a dopant type of the drain 54 and the source 64 could be changed to meet different demands for the product and its function. A depth of the drain 54 is deeper than a depth of the source 64 and a vertical transistor 66 is formed, as FIG. 6 shows. A checkerboard trench DRAM 20 is formed.

Please notice, the depth of the drain 54 is deeper than the depth of the source 64, and the fabrication utilizes different energies and ion doses to form the drain 54 and the source 64. For example, an energy of the ion implantation process utilized to form the drain 54 is greater than an energy utilized for forming the source 64. The ion dose of the ion implantation process for forming the drain 54 is higher than the ion dose utilized for forming the source 64. Both of them make the depth of the drain 54 deeper than the depth of the source 64. Of course, the greater energy of the ion implantation process and the higher ion dose can make the drain 54 deeper; lower energy in the ion implantation process and a lower ion dose can also make the source 64 shallower. As FIG. 6 shows, the depth of the drain 54 is deeper than the depth of the source 64. Of course, the depth of the drain 54 cannot be so deep as to destroy the lower electrode 220, else the capacitor 12 cannot function normally.

Compared to the prior art, the depth of the drain of the transistor is deeper than the depth of the source in the present invention; the drain and the source have the same depths in the prior art. Therefore, the channel length of the transistor in the present invention is longer, such that leakage current is decreased, speed is faster than in the prior art transistor, and electric performance is better. In addition, the present invention need only utilize different energies in the ion implantation processes or utilize different ion doses to control the depths of the drain and the source easily. The fabrication is also simpler.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic random access memory (DRAM) on a silicon substrate, comprising:
   at least an active area on the silicon substrate;
   a plurality of gate conductors on the silicon substrate;
   a plurality of deep trench capacitors, each deep trench capacitor is positioned in the silicon substrate at respective intersections of the plurality of gate conductors and the active area; and
   a plurality of vertical transistors in the silicon substrate, each vertical transistor is coupled to each respective deep trench capacitor to form a memory cell, each vertical transistor further comprising:
   a gate;
   a source in one side of the gate; and
   a drain in another side of the gate, a depth of the source is different from a depth of the drain.

2. The DRAM of claim 1, wherein the DRAM is a checkerboard trench-DRAM.

3. The DRAM of claim 1, wherein the active area is perpendicular to the gate conductors.

4. The DRAM of claim 1, wherein each deep trench capacitor comprises a lower electrode, an upper electrode, and a dielectric layer between the upper electrode and the lower electrode.

5. The DRAM of claim 1, wherein the silicon substrate further comprises a plurality of shallow trench isolations (STI) and single sided buried straps.

6. The DRAM of claim 5, wherein the silicon substrate further comprises a plurality of gate recesses, and each gate is in each respective gate recess.

7. The DRAM of claim 6, wherein each transistor further comprises a gate insulating layer between the silicon substrate and the gate.

8. The DRAM of claim 1, wherein the depth of the drain is deeper than the depth of the source.

* * * * *